(12) United States Patent
Leatherman et al.

(10) Patent No.: US 7,889,013 B2
(45) Date of Patent: Feb. 15, 2011

(54) MICROELECTRONIC DIE HAVING CMOS RING OSCILLATOR THEREON AND METHOD OF USING SAME

(75) Inventors: Gerald S. Leatherman, Hillsboro, OR (US); Jun He, Portland, OR (US); Jose Maiz, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 247 days.

(21) Appl. No.: 11/846,190

(22) Filed: Aug. 28, 2007

(65) Prior Publication Data

US 2009/0058540 A1 Mar. 5, 2009

(51) Int. Cl.
*H03K 3/03* (2006.01)

(52) U.S. Cl. ............................ 331/57; 257/48; 257/737; 257/738; 438/199

(58) Field of Classification Search .................. 331/57; 257/737, 738, 48; 438/199
See application file for complete search history.

(56) References Cited

U.S. PATENT DOCUMENTS

| | | | | |
|---|---|---|---|---|
| 6,657,504 B1 * | 12/2003 | Deal et al. | ..................... | 331/57 |
| 6,724,214 B2 * | 4/2004 | Manna et al. | ................ | 324/766 |
| 6,903,564 B1 * | 6/2005 | Suzuki | ........................ | 324/763 |
| 7,190,233 B2 * | 3/2007 | Bhushan et al. | ................ | 331/44 |
| 7,242,093 B2 * | 7/2007 | Ueda | ............................ | 257/737 |
| 7,268,399 B2 * | 9/2007 | Bowen et al. | ................ | 257/369 |
| 2003/0134496 A1 * | 7/2003 | Lee et al. | ...................... | 438/612 |
| 2005/0040397 A1 * | 2/2005 | Hui et al. | ....................... | 257/48 |
| 2005/0118758 A1 * | 6/2005 | Yuan et al. | ................... | 438/199 |
| 2005/0139929 A1 * | 6/2005 | Rost | ............................. | 257/369 |
| 2005/0140418 A1 * | 6/2005 | Muniandy et al. | ............ | 327/291 |
| 2005/0218871 A1 * | 10/2005 | Kang et al. | .................. | 323/265 |
| 2005/0225415 A1 * | 10/2005 | Mahony et al. | .............. | 335/302 |
| 2005/0273290 A1 * | 12/2005 | Asano et al. | ................. | 702/117 |
| 2006/0043579 A1 * | 3/2006 | He et al. | ....................... | 257/712 |
| 2007/0013452 A1 * | 1/2007 | Bhushan et al. | ............... | 331/57 |
| 2008/0136400 A1 * | 6/2008 | Chi et al. | ...................... | 323/318 |
| 2008/0258700 A1 * | 10/2008 | Block et al. | .................. | 323/318 |
| 2008/0270049 A1 * | 10/2008 | Kim et al. | ...................... | 702/58 |

* cited by examiner

*Primary Examiner*—Arnold Kinkead
*Assistant Examiner*—Richard Tan
(74) *Attorney, Agent, or Firm*—Blakely, Sokoloff, Taylor & Zafman LLP

(57) ABSTRACT

A microelectronic die including a CMOS ring oscillator thereon, and a method of using the same. The microelectronic die includes: a die substrate; and a plurality of CMOS ring oscillators on the die substrate, the ring oscillators being disposed at regions of the die substrate that are adapted to exhibit differing strain responses to package-included stress with respect to one another. A method of determining mechanical stress on a die which includes providing a die substrate in a CMOS ring oscillator on a die substrate. A frequency counter is coupled to the ring oscillator to measure a frequency of the ring oscillator to generate a frequency data signal therefrom. The frequency data signal is used to determine the mechanical stress on the die at a location of the ring oscillator.

11 Claims, 3 Drawing Sheets

MICROELECTRONIC DIE HAVING CMOS RING OSCILLATOR THEREON AND METHOD OF USING SAME

FIELD

Embodiments of the present invention relate generally to the field of microelectronic fabrication, and, in particular to systems and structures for measuring the mechanical stress on dice.

BACKGROUND

Conventionally, finite element mechanical modeling is used for in-situ measurement of mechanical stresses imparted to a silicon die on commercial packaged microelectronic parts or on certification test vehicles. However, such modeling typically involves approximations that do not provide accurate enough determinations of those stresses.

Alternatively, Raman spectroscopy may be used for measuring stress applied to silicon. However to do so requires the use of precision spectroscopy tools and also requires that the silicon to be measured be exposed to the view of the beam, making it impossible to measure silicon encased on a microelectronic package.

Figure 1:
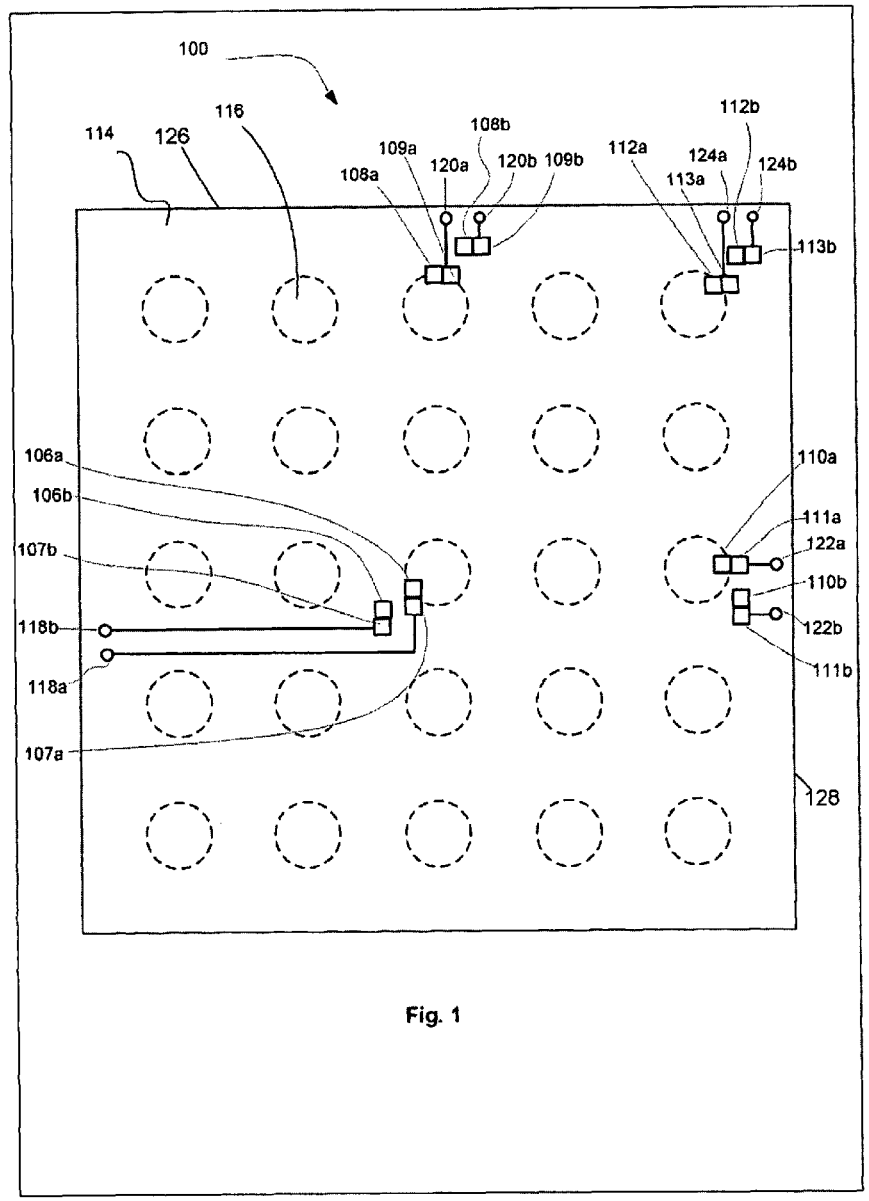
FIG. 1 is a schematic top plan view of a die according to an embodiment.

For simplicity and clarity of illustration, elements in the drawings have not necessarily been drawn to scale. For example, the dimensions of some of the elements may be exaggerated relative to other elements for clarity. Where considered appropriate, reference numerals have been repeated among the drawings to indicate corresponding or analogous elements.

DETAILED DESCRIPTION

In the following detailed description, a microelectronic die including a CMOS stress sensor thereon, a method of using the sensor, and a system including the die are disclosed. Reference is made to the accompanying drawings within which are shown, by way of illustration, specific embodiments by which the present invention may be practiced. It is to be understood that other embodiments may exist and that other structural changes may be made without departing from the scope and spirit of the present invention.

The terms on, above, below, and adjacent as used herein refer to the position of one element relative to other elements. As such, a first element disposed on, above, or below a second element may be directly in contact with the second element or it may include one or more intervening elements. In addition, a first element disposed next to or adjacent a second element may be directly in contact with the second element or it may include one or more intervening elements. In addition, in the instant description, figures and/or elements may be referred to in the alternative. In such a case, for example where the description refers to Figs. X/Y showing an element A/B, what is meant is that FIG. X shows element A and FIG. Y shows element B.

Aspects of this and other embodiments will be discussed herein with respect to FIGS. 1-5 below. The figures, however, should not be taken to be limiting, as it is intended for the purpose of explanation and understanding.

Referring to FIG. 1 by way of example, embodiments include a microelectronic die, such as die 100 having a die substrate 102 including CMOS ring oscillators 106a, 106b, 108a, 108b, 110a, 110b, and 112a, 112b thereon. According to embodiments, the ring oscillators are disposed at regions of the die substrate that are adapted to exhibit differing strain responses to package-induced stress with respect to one another. Such regions may include at least any two of the center region of the die, the horizontal and/or vertical edge regions of the die, and a corner region of the die, as shown by way of example in FIG. 1 for the ring oscillators 106a, 106b, 108a, 108b, 110a, 110b, and 112a, 112b thereon. Such regions may further include a first region that may be disposed near a blunt object on the surface of the die where the stress is desired to be measured, such as, for example, at the edge of a die bump or on the die bump, and a second region at a proximity of the first region, where stresses occurring as a function of the presence of the blunt object may be deemed to be negligible, but where other stresses present may be deemed to be similar to the stresses present at the first region. The provision of ring oscillators at such regions of differing strain response to package-induced stress would advantageously allow the measurement of frequency shifts at those respective regions, and thus a deconvolution of stresses present at the respective regions, as will be explained in more detail below.

Figure 2:
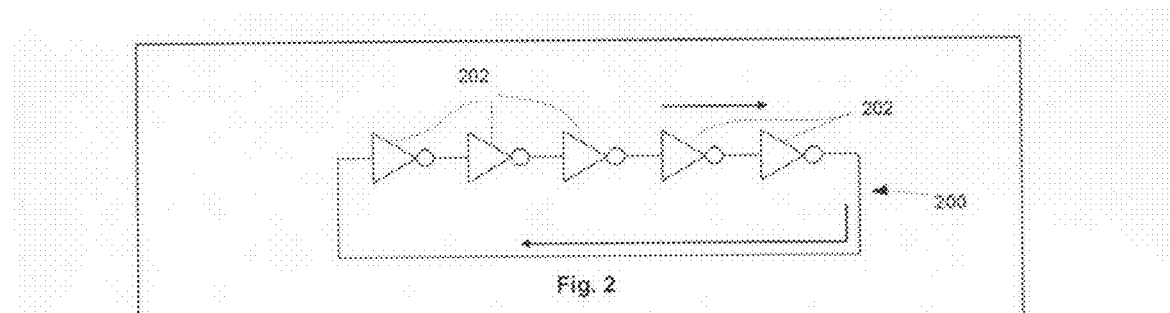
FIG. 2 is a diagram of a conventional ring oscillator.

The ring oscillators of the exemplary embodiment of FIG. 1 are shown as having been provided on the mounting side 114 of the die substrate 102, that is, on a side thereof adapted to be mounted onto a package substrate, as would be recognized by one skilled in the art, although embodiments are not so limited, and include the provision of one or more ring oscillators at any location on the die where a mechanical strain and stress on the die is desired to be determined. In the shown embodiment of a die, the mounting side 114 includes an array of conductive die bumps 116 thereon (not to scale). By "die bump," what is meant in the context of the instant application is a site on a die adapted to allow an electrical and mechanical joining of the die with another microelectronic component, such as, for example, by way of a solder connection. In the shown embodiment, each of the ring oscillators 106a, 106b, 108a, 108b, 110a, 110b, and 112a, 112b is coupled to a respective frequency counter 107a, 107b, 109a, 109b, 111a, 111b and 113a, 113b, although embodiments are not so limited, and include within their ambit one or more frequency counters coupled to a plurality of the ring oscillators, and adapted to switch between the plurality of ring oscillators to generate a frequency data signals from respective ones of said plurality (not shown). Each of the frequency counters is adapted to measure a frequency of the ring oscillator to which it is coupled, and to generate a frequency data signal therefrom. The die 100 further includes contact pads 118a, 118b, 120a, 120b, 122a, 122b, and 124a, 124b coupled to respective ones of the frequency counters 107a, 107b, 109a, 109b, 111a, 111b and 113a, 113b. It is noted that the configuration of frequency counters and contact pads in FIG. 1 is also merely exemplary, and that embodiments would include within their scope the provision of any suitable circuitry including any number of frequency counters and contact pads to allow a measurement of frequency shifts for the individual ring oscillators, as would be recognized by one skilled in the art. Where an embodiment includes one or more frequency counters each of which is coupled to more than one ring oscillator (not shown), enough contact pads may be provided on the die to accommodate receiving frequency data signals from each of the frequency counters, as would be recognized by the skilled person By "CMOS ring oscillator," what is meant in the context of the instant description is a ring oscillator, such as a conventional ring oscillator including CMOS inverters. As is well known, ring oscillators are devices commonly used in test chips as an indicator of transistor speed. A drawing of a conventional ring oscillator, such as a CMOS ring oscillator, is shown by way of example in FIG. 2. Ring oscillator 200 of FIG. 2 includes a chain of inverters 202, with the output of the previous inverter connected to the input of the next inverter and the output of the last inverter tied to the input of the first. For a CMOS ring oscillator, each inverter includes two (opposite type) transistors per inverter circuit, that is, two transistors per inverter circuit, one of the transistors being a NMOS transistor, and the other one being a PMOS transistor. Since the total number of inverters in the chain of a CMOS ring oscillator, such as oscillator 200 of FIG. 2, is an odd number, there will be no steady state logic configuration for the oscillator circuit, and the circuit will oscillate as the state transition propagates around the loop. As a result, the electrical signal at any output node will oscillate at a frequency which is dependent on the number of inverters in the loop, and further on the electrical characteristics of the individual transistors which make up the inverters. Embodiments contemplate using a CMOS ring oscillator on a die to determine strain and/or stress at a location of the ring oscillator based on the following principle: when mechanical strain is applied to a silicon based transistor, the electron band structure of the silicon lattice in the transistor channel becomes distorted. This distortion can happen in such as way that the carrier mobility is either enhanced or reduced, and depends on both the magnitude and direction of the strain. A change in the carrier mobility in turn results in a change in the saturated drive current of the transistor, which causes a change in the switching speed of the individual inverters making up the ring oscillator circuit, such as ring oscillator 200 of FIG. 2. Thus a change in mechanical stress on the silicon can be detected as a shift in the oscillation frequency of the ring oscillator circuit.

Thus, referring still to FIG. 1, each frequency counter may be used to measure a shift in the oscillation frequency of an associated ring oscillator circuit in order to allow a determination of strain at a location of the ring oscillator on the die, which would in turn allow a determination of stress in a well known manner. A determination of strain may, according to one embodiment, be made by way of comparing the processed frequency shifts to well known calibrated strain versus frequency curves for each ring oscillator. For example, according to one embodiment, to measure the package-induced stress at a given location of a ring oscillator in FIG. 1, the frequency from the ring oscillator may be measured before packaging of the die, that is, at wafer sort, and, subsequently, after packaging, that is, at class test. The frequency shifts thus obtained may then be compared, as noted above, to calibrated frequency curves of the ring oscillators to deduce the amount of stress imparted to the die by the package.

In general, it is desirable to be able to measure all three principal components of the stress on the silicon. However, using a single CMOS ring oscillator on the die substrate provides only one output: a ring oscillator frequency. As noted above, inverters making up the ring oscillator device typically include both NMOS and PMOS transistors. While both NMOS and PMOS are necessary for a CMOS functioning inverter, the inverters can, according to one embodiment, be NMOS weighed and/or PMOS weighed by varying the width of the transistors making up each inverter. Since NMOS and PMOS carrier mobility have different dependences on silicon strain with respect to one another, an additional independent measurement can be made by using both PMOS and NMOS weighted ring oscillators at any given die location.

$$\Delta f_N = a_{N,1} \cdot \Delta s_1 + a_{N,2} \cdot \Delta s_2 + a_{N,3} \cdot \Delta s_3$$

$$\Delta f_P = a_{P,1} \cdot \Delta s_1 + a_{P,2} \cdot \Delta s_2 + a_{P,3} \cdot \Delta s_3$$

Where $\Delta f_N$ and $\Delta f_P$ represent the change in frequency for the N-weighted and P-weighted oscillators, respectively. $\Delta s_1$ represents the change in stress state of the $i^{th}$ principle component of stress, and $a_{N,i}$ and $a_{P,i}$ represent the changes in frequency expected due to a change in the $i^{th}$ principle component of stress for the N or P-weighted oscillator.

This still allows only a measurement of two quantities (NMOS and PMOS mobility change), with three unknowns (three principal stress components). One solution to this problem according to an embodiment is to position the oscillators at strategic locations on the die where one or more of the principal components of the package-induced stress are known to be small, and where the third principle component of the packaged-induced stress is known to have a maximum value. For the die edge and corner principal locations, as the oscillator approaches the extreme edge of the die, one or more of the principal stress components will go to zero. Therefore, optimally an oscillator may be placed as close to the edge or corner as possible. In practice, if an oscillator can be placed close enough so that the package-induced principal stress components in question can be kept to less than 0-10% of the package-induced principal stress component of interest, then useful data can be obtained. FIG. 1 shows examples of these locations for one embodiment. By "principal stress component," what is meant in the context of the instant description is a component of the stress that is either (a) in an in-plane direction of the die substrate onto which one or more ring oscillators are mounted either parallel to the horizontal edge 126 of the die (X direction), or parallel to the vertical edge 128 of the die (Y direction); or (b) in a direction perpendicular to the X and Y directions (Z direction). By "horizontal" and "vertical," the instant description is not intended to limit the description of embodiments, but rather merely refers to the orientation of the die edges as seen in the view of FIG. 1.

A prior knowledge of regions of the die where one of the principal stress components may be assumed to have a maximum value may guide a strategic positioning of one or more ring oscillators as described above in order to allow a measurement of such stress component, and further to aid in de-convolution of the individual principal stress components from one another. Typically, for a die that is either rectangular or square shaped in a top or bottom plan view thereof, strategic positions where one of the package-induced principal stress components may be assumed to have a maximum value and where one or more of the package-induced principal stress components may have a small value correspond to the following four locations: a center region of the die substrate, a horizontal edge region of the die substrate, a vertical edge region of the die substrate, a corner region of the die substrate. Thus, as seen in FIG. 1, ring oscillators 106a and 106b, and associated frequency counters 107a and 107b, are located at the center region of die 100; ring oscillators 108a and 108b, and associated frequency counters 109a and 109b, are located at the horizontal edge region of die 100; ring oscillators 110a and 110b, and associated frequency counters 111a and 111b, are located at the vertical edge region of die 100; and ring oscillators 112*a* and 112*b*, and associated frequency counters 113*a* and 113*b*, are located at the corner region of die 100.

Since the stress field on a flip chip part is also strongly influenced by its location with respect to the nearest C4 bump, according to one embodiment, at least two sensors may be placed at each location where a ring oscillator is needed: one at a location, with respect to the bump, known to experience the maximum stress effect due to the bump (such as the edge of the bump facing either toward or away from the die center, where maximum out-of-plane stress is expected), and another at a proximity to the bump but removed to an extent that the stress at its location is not affected by the bump. In this case, equations (previously given) may be used to deduce the additional mechanical stress induced by the bump.

In view of the above, an embodiment may include placing one ring oscillator at each location where stress is to be determined, two ring oscillators at that same location (one ring oscillator being NMOS weighed and the other being PMOS weighed), four ring oscillator at that same location (one ring oscillator being NMOS weighed and being placed at a die bump edge or other strategically chosen location on the bump, one ring oscillator being PMOS weighed and being placed at the die bump edge or other strategically chosen location on the bump, one ring oscillator being NMOS weighed and being placed at a proximity of the die bump edge, and one ring oscillator being PMOS weighed and being placed at the proximity of the die bump edge), or any combination of the above. Thus, according to an embodiment, any die location where frequency shift measurements may be taken may include anywhere from one to four ring oscillators. Embodiments further include the provision of multiple ring oscillators on a die at regions where differing strain responses are expected to package induced stress. It is noted that embodiments are not necessarily limited to the use of ring oscillators at the given differing regions, but include within their scope the use of transistors in the same locations as described in detail above for the ring oscillators. In such a case, a measurement of electrical characteristics of the respective transistors would yield various stress values at the locations of the transistors.

Figure 3:
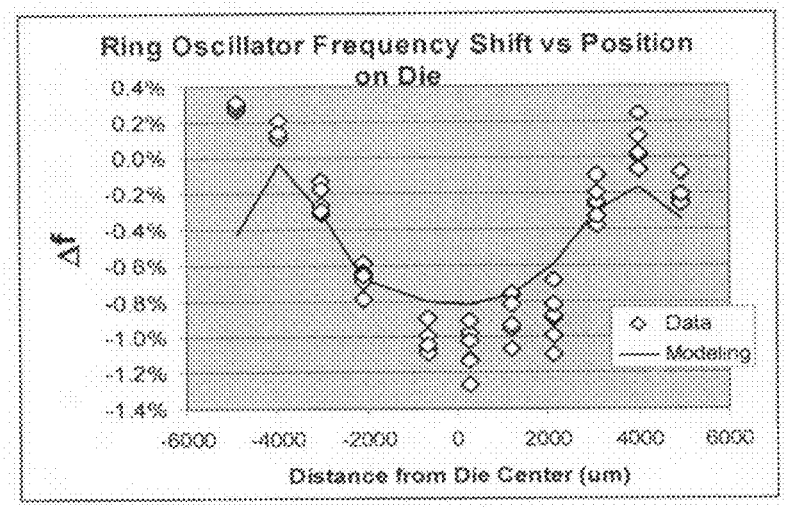
FIG. 3 is a graph plotting frequency shift versus sensor position placed on a given die according to an embodiment.
Figure 4:
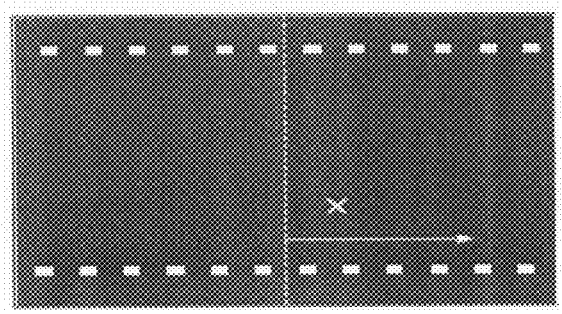
FIG. 4 is a schematic top plan view of the die including sensors used to obtain the data shown on the graph of FIG. 3.

FIGS. 3 and 4 show the frequency shift due to packaging for ring oscillators on a packaged microelectronic certification test vehicle. The value shown on the Y axis in FIG. 3 is the difference in frequency shift between a first type of packaging and second, different type of packaging where the thickness of the die was different with respect to the first type of packaging. The line on the graph in FIG. 3 represents the results of finite element modeling in which the stress for the first type of packaging was calculated and converted into an expected frequency shift using a calibrated stress versus frequency curve. The locations on the die of the oscillators for this particular experiment are shown in FIG. 4. Note that these locations are arbitrary and for this particular data set are not the locations of worst-case expected package-induced stress, or strategic locations, as proposed above. Thus, the oscillators used in this example are not located in the ideal positions defined in FIG. 1 above. However, they serve to demonstrate the use of embodiments even though they do not capture the exact locations of maximum stress on the die.

Advantageously, embodiments provide a microelectronic die and method that allow an in-situ measurement of the mechanical stress imparted to a silicon die as a result of packaging using electrical tests. Embodiments bring about the above advantage by providing a microelectronic die which includes: a die substrate and a plurality of CMOS ring oscillators on the die substrate, the ring oscillators being disposed at regions of the die substrate that are adapted to exhibit differing strain responses to package-induced stress with respect to one another. Oscillators according to embodiments may advantageously be of standard design, or preferably include custom oscillators that are NMOS and PMOS weighed to advantageously allow the differentiation of principal stress components. Advantageously, using ring oscillators allow an easy multiplexing of the oscillators and require only measurement of frequency. Moreover, advantageously, embodiments allow an in-situ measurement of package-induced stress on a die without the use of modeling and of the approximations associated with such modeling.

Figure 5:
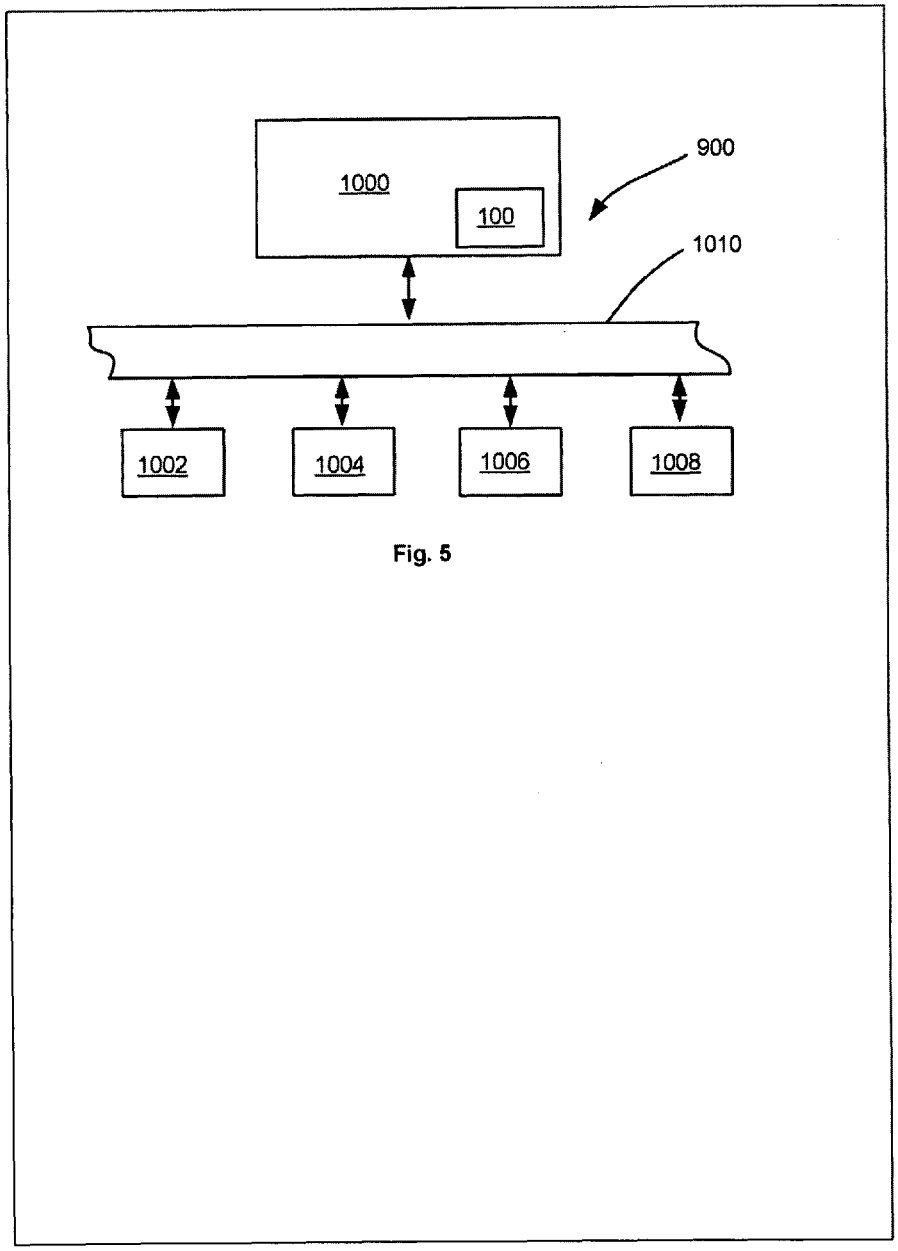
FIG. 5 is a schematic view of an embodiment of a system incorporating a microelectronic die, such as the die of FIG. 1.

Referring to FIG. 5, there is illustrated one of many possible systems 900 in which embodiments of the present invention may be used. In one embodiment, the electronic assembly 1000 may include a microelectronic die, such as die 100 of FIG. 1. Assembly 1000 may further include a microprocessor. In an alternate embodiment, the electronic assembly 1000 may include an application specific IC (ASIC). Integrated circuits found in chipsets (e.g., graphics, sound, and control chipsets) may also be packaged in accordance with embodiments of this invention.

For the embodiment depicted by FIG. 5, the system 900 may also include a main memory 1002, a graphics processor 1004, a mass storage device 1006, and/or an input/output module 1008 coupled to each other by way of a bus 1010, as shown. Examples of the memory 1002 include but are not limited to static random access memory (SRAM) and dynamic random access memory (DRAM). Examples of the mass storage device 1006 include but are not limited to a hard disk drive, a compact disk drive (CD), a digital versatile disk drive (DVD), and so forth. Examples of the input/output module 1008 include but are not limited to a keyboard, cursor control arrangements, a display, a network interface, and so forth. Examples of the bus 1010 include but are not limited to a peripheral control interface (PCI) bus, and Industry Standard Architecture (ISA) bus, and so forth. In various embodiments, the system 90 may be a wireless mobile phone, a personal digital assistant, a pocket PC, a tablet PC, a notebook PC, a desktop computer, a set-top box, a media-center PC, a DVD player, and a server.

The various embodiments described above have been presented by way of example and not by way of limitation. Having thus described in detail embodiments of the present invention, it is understood that the invention defined by the appended claims is not to be limited by particular details set forth in the above description, as many variations thereof are possible without departing from the spirit or scope thereof.

What is claimed is:

1. A microelectronic die comprising: a die substrate; and a plurality of CMOS ring oscillators on the die substrate, the ring oscillators being disposed at regions of the die substrate that are adapted to exhibit differing strain responses to package-induced stress with respect to one another; and wherein at least one of the ring oscillators is disposed at a first region of the die substrate where one of three principal components of the package-induced stress may be assumed to be at its maximum value, and at least one of the ring oscillators is disposed at a second region of the die substrate where another one of the three principal components of package-induced stress may be assumed to be at its maximum value.

2. The die of claim 1, wherein the surface of the die includes die bumps thereon, and wherein:

the at least one of the ring oscillators at the first region includes one ring oscillator disposed at an edge of a die bump or on the die bump, and another one of the ring oscillators at the first region includes one ring oscillator disposed at a proximity of the die bump;

the at least one of the ring oscillators at the second region includes one ring oscillator disposed at an edge region of a die bump or on the die bump, and another one of the ring oscillators at the second region includes one ring oscillator disposed at a proximity of the die bump.

3. The die of claim 1, wherein the plurality of ring oscillators includes: a first ring oscillator disposed at a center region of the die substrate; a second ring oscillator disposed at a horizontal edge region of the die substrate; a third ring oscillator disposed at a vertical edge region of the die substrate; and a fourth ring oscillator disposed at a corner region of the die substrate.

4. A microelectronic die comprising:
a die substrate; and
a plurality of CMOS ring oscillators on the die substrate, the ring oscillators being disposed at regions of the die substrate that are adapted to exhibit differing strain responses to package-induced stress with respect to one another;
wherein the die substrate includes die humps thereon, and wherein the plurality of ring oscillators includes:
a first ring oscillator disposed at a first region of the die substrate at an edge region of a first die hump or on the first die bump;
a second ring oscillator disposed at the first region at a proximity of the first die bump;
a third ring oscillator disposed at a second region of the die substrate at an edge region of a second die bump or on the second die bump; and
a fourth ring oscillator disposed at the second region of the die substrate at a proximity of the second die bump, wherein the first region and the second region are adapted to exhibit differing strain responses to package-induced stress with respect to one another.

5. A microelectronic die comprising:
a die substrate; and
a plurality of CMOS ring oscillators on the die substrate, the ring oscillators being disposed at regions of the die substrate that are adapted to exhibit differing strain responses to package-induced stress with respect to one another;
wherein at least one of the ring oscillators is NMOS weighed, and at least one of the ring oscillators is PMOS weighed;
wherein the die substrate includes die bumps thereon, and wherein the plurality of ring oscillators includes:
a first NMOS weighed ring oscillator disposed at an edge of a die bump;
a first PMOS weighed ring oscillator disposed at an edge of the die bump;
a second NMOS weighed ring oscillator disposed at a proximity of the die bump; and
a second PMOS weighed ring oscillator disposed at a proximity of the die bump.

6. A microelectronic die comprising; a die substrate; and a plurality of CMOS ring oscillators on the die substrate, the ring oscillators being disposed at regions of the die substrate that are adapted to exhibit differing strain responses to package-induced stress with respect to one another; wherein the die substrate includes die bumps thereon, and wherein the plurality of ring oscillators includes: a first ring oscillator disposed at an edge of a center region die bump or on the center region die bump; a second ring oscillator disposed at a proximity of the center region die bump; a third ring oscillator disposed at an edge of a horizontal edge region die bump or on the horizontal region die bump; a fourth ring oscillator disposed at a proximity of the horizontal edge region die bump; a fifth ring oscillator disposed at an edge of a vertical edge region die bump or on the vertical edge region die bump; a sixth ring oscillator disposed at a proximity of the vertical edge region die bump; a seventh ring oscillator disposed at an edge of a corner region die bump or on the corner region die bump; and an eighth ring oscillator disposed at a proximity of the corner region die bump.

7. A microelectronic die comprising:
a die substrate; and
a plurality of CMOS ring oscillators on the die substrate, the ring oscillators being disposed at regions of the die substrate that are adapted to exhibit differing strain responses to package-induced stress with respect to one another;
wherein at least one of the ring oscillators is NMOS weighed, and at least one of the ring oscillators is PMOS weighed;
wherein the die substrate includes die bumps thereon, and wherein the plurality of ring oscillators includes:
a first NMOS weighed ring oscillator disposed at an edge of a center region die bump or on the center region die hump;
a first PMOS weighed ring oscillator disposed at an edge of the center region die hump or on the center region die hump;
a second NMOS weighed ring oscillator disposed at a proximity of the center region die hump;
a second PMOS weighed ring oscillator disposed at a proximity of the center region die bump;
a third NMOS weighed ring oscillator disposed at an edge of a horizontal edge region die hump or on the horizontal edge region die hump;
a third PMOS weighed ring oscillator disposed at an edge of the horizontal edge region die bump or on the horizontal edge region die bump;
a fourth NMOS weighed ring oscillator disposed at a proximity of the horizontal edge region die bump;
a fourth PMOS weighed ring oscillator disposed at a proximity of the horizontal edge region die bump;
a fifth NMOS weighed ring oscillator disposed at an edge of a vertical edge region die bump or on the vertical edge region die bump;
a fifth PMOS weighed ring oscillator disposed at an edge of the vertical edge region die bump or on the vertical edge region die bump;
a sixth NMOS weighed ring oscillator disposed at a proximity of the vertical edge region die bump;
a sixth PMOS weighed ring oscillator disposed at a proximity of the vertical edge region die bump;
a seventh NMOS weighed ring oscillator disposed at an edge of a corner region die bump or on the corner region die bump;
a seventh PMOS weighed ring oscillator disposed at an edge of the corner region die bump or on the corner region die bump;
an eighth NMOS weighed ring oscillator disposed at a proximity of the corner region die bump; and
an eighth PMOS weighed ring oci1lator disposed at a proximity of the corner region die hump.

8. A method of determining mechanical stress on a die comprising: providing a microelectronic die comprising: a die substrate; a CMOS ring oscillator on the die substrate; providing a frequency counter coupled to the ring oscillator to measure a frequency of the ring oscillator and to generate a frequency data signal therefrom; wherein the ring oscillator includes a plurality of ring oscillators on the die substrate, the ring oscillators being disposed at regions of the die substrate that are different from one another with respect to respective strain responses thereof; and using the frequency data signal from each of the plurality of ring oscillators to determine the mechanical stress on the die at a location of the ring oscillator, wherein at least one of the ring oscillators is disposed at a first region of the die substrate where one of three principal stress components may be assumed to be at its maximum value, and at least one of the ring oscillators is disposed at a second region of the die substrate where another one of the three principal stress components may be assumed to be at its maximum value.

9. The method of claim 8, wherein the surface of the die includes die bumps thereon, and wherein:
   the at least one of the ring oscillators at the first region includes one ring oscillator disposed at an edge of a die bump or on the die bump, and another one of the ring oscillators at the first region includes one ring oscillator disposed at a proximity of the die bump;
   the at least one of the ring oscillators at the second region includes one ring oscillator disposed at an edge region of a die bump or on the die bump, and another one of the ring oscillators at the second region includes one ring oscillator disposed at a pa City of the die bump.

10. The method of claim 8, wherein:
   the plurality of ring oscillators includes:
      a first ring oscillator disposed at a center region of the die substrate;
      a second ring oscillator disposed at a horizontal edge region of the die substrate;
      a third ring oscillator disposed at a vertical edge region of the die substrate; and
      a fourth ring oscillator disposed at a c region of the die substrate; and
   using the frequency data signal includes using each frequency data signal to determine:
      a uniaxial in-plane compressive stress parallel to a horizontal edge of the die;
      a uniaxial in-plane compressive stress parallel to a vertical edge of the die;
      a uniaxial out-of-plane stress perpendicular to the horizontal edge and to the vertical edge of the die.

11. The method of claim 8, wherein: the plurality of ring oscillators includes: a first ring oscillator disposed at an edge of a center region die bump or on the center region die bump; a second ring oscillator disposed at a proximity of the center region die bump; a third ring oscillator disposed at an edge of a horizontal edge region die bump or on the horizontal region die bump; a fourth ring oscillator disposed at a proximity of the horizontal edge region die bump; a fifth ring oscillator disposed at an edge of a vertical edge region die bump or on the vertical edge region die bump; a sixth ring oscillator disposed at a proximity of the vertical edge region die bump; a seventh ring oscillator disposed at an edge of a corner region die bump or on the corner region die bump; and an eighth ring oscillator disposed at a proximity of the corner region die bump; and using the frequency data signal includes using each frequency data signal to determine: a uniaxial in-plane compressive stress parallel to a horizontal edge of the die; a uniaxial in-plane compressive stress parallel to a vertical edge of the die; a uniaxial out-of-plane stress perpendicular to the horizontal edge and to the vertical edge of the die.

\* \* \* \* \*

UNITED STATES PATENT AND TRADEMARK OFFICE
CERTIFICATE OF CORRECTION

| | | |
|---|---|---|
| PATENT NO. | : 7,889,013 B2 | Page 1 of 1 |
| APPLICATION NO. | : 11/846190 | |
| DATED | : February 15, 2011 | |
| INVENTOR(S) | : Leatherman et al. | |

It is certified that error appears in the above-identified patent and that said Letters Patent is hereby corrected as shown below:

In column 7, at line 20 delete, "humps" and insert --bumps--.

In column 7, at line 23 delete, "hump" and insert --bump--.

In column 8, at line 22 delete, "hump" and insert --bump--.

In column 8, at line 24 delete, "hump" and insert --bump--.

In column 8, at line 25 delete, "hump" and insert --bump--.

In column 8, at line 27 delete, "hump" and insert --bump--.

In column 8, at line 31 delete, "hump" and insert --bump--.

In column 8, at line 32 delete, "hump" and insert --bump--.

In column 8, at line 58 delete, "oscillator" and insert --oscillator--.

In column 8, at line 59 delete, "hump" and insert --bump--.

In column 9, at line 23 delete, "pa City" and insert --proximity--.

In column 10, at line 1 delete, "c" and insert --corner--.

Signed and Sealed this
Ninth Day of August, 2011

David J. Kappos
*Director of the United States Patent and Trademark Office*